United States Patent
Guo et al.

(10) Patent No.: US 10,976,854 B2
(45) Date of Patent: Apr. 13, 2021

(54) FORCE TOUCH DISPLAY PANEL, DETECTION METHOD THEREOF, AND DISPLAY APPARATUS

(71) Applicant: BOE TECHNOLOGY GROUP CO., LTD., Beijing (CN)

(72) Inventors: Yuzhen Guo, Beijing (CN); Xue Dong, Beijing (CN); Haisheng Wang, Beijing (CN); Yingming Liu, Beijing (CN); Xiaoliang Ding, Beijing (CN); Xueyou Cao, Beijing (CN); Lijun Zhao, Beijing (CN); Chihjen Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/332,780

(22) PCT Filed: Jun. 15, 2018

(86) PCT No.: PCT/CN2018/091479
§ 371 (c)(1),
(2) Date: Mar. 12, 2019

(87) PCT Pub. No.: WO2019/041973
PCT Pub. Date: Mar. 7, 2019

(65) Prior Publication Data
US 2019/0361559 A1 Nov. 28, 2019

(30) Foreign Application Priority Data
Aug. 29, 2017 (CN) .......................... 201710756443.7

(51) Int. Cl.
*G06F 3/041* (2006.01)
*G06F 3/044* (2006.01)
(Continued)

(52) U.S. Cl.
CPC ........ *G06F 3/0414* (2013.01); *G02F 1/13338* (2013.01); *G06F 3/0412* (2013.01);
(Continued)

(58) Field of Classification Search
CPC .... G06F 3/0414; G06F 3/0443; G06F 3/0412; G06F 2203/04103; G06F 2203/04105;
(Continued)

(56) References Cited

U.S. PATENT DOCUMENTS 10,156,949 B2 * 12/2018 Lee .......................... G06F 3/044
2011/0096025 A1 * 4/2011 Slobodin ............... G06F 3/0447
345/174

(Continued)

FOREIGN PATENT DOCUMENTS

CN 105867682 A * 8/2016
CN 106527822 A * 3/2017

*Primary Examiner* — Julie Anne Watko
(74) *Attorney, Agent, or Firm* — McDermott Will & Emery LLP

(57) ABSTRACT

Embodiments of the present disclosure provide a force touch display panel, a detection method thereof, and a display apparatus. The force touch display panel includes: a substrate; a display structure disposed in a display area on the substrate; and a force common electrode layer, a piezoelectric material layer, and a force sense electrode layer, which are stacked in sequence over the display structure. The force sense electrode layer includes a force sense electrode configured for identifying different forces, and the force sense electrode additionally serves as a touch detection electrode configured for identifying a touch operation.

19 Claims, 10 Drawing Sheets

(51) Int. Cl.
*G02F 1/1333* (2006.01)
*H01L 41/27* (2013.01)
*H01L 41/297* (2013.01)
*H01L 41/311* (2013.01)
*H01L 27/32* (2006.01)
*H01F 41/00* (2006.01)

(52) U.S. Cl.
CPC .......... *G06F 3/0443* (2019.05); *H01L 27/323* (2013.01); *H01L 41/27* (2013.01); *G02F 2201/121* (2013.01); *G06F 3/04146* (2019.05); *G06F 2203/04103* (2013.01); *G06F 2203/04105* (2013.01); *H01F 41/00* (2013.01); *H01L 41/297* (2013.01); *H01L 41/311* (2013.01)

(58) Field of Classification Search
CPC ............. G06F 3/04146; G02F 1/13338; G02F 2201/121; H01L 27/323; H01L 41/27; H01L 41/297; H01L 41/311; H01F 41/00
See application file for complete search history.

(56) References Cited

U.S. PATENT DOCUMENTS

| | | | | |
|---|---|---|---|---|
| 2013/0155059 A1* | 6/2013 | Wang | ...................... | G06F 3/041 345/419 |
| 2016/0188082 A1* | 6/2016 | Ham | .................... | G06F 3/0412 345/174 |
| 2017/0228065 A1* | 8/2017 | Lee | ......................... | G06F 3/044 |
| 2018/0088718 A1* | 3/2018 | Liu | .......................... | G06F 3/044 |

* cited by examiner

FORCE TOUCH DISPLAY PANEL, DETECTION METHOD THEREOF, AND DISPLAY APPARATUS

CROSS-REFERENCE OF RELATED APPLICATIONS

This application is the U.S. National Phase under 35 U.S.C. § 371 of International Patent Application No. PCT/CN2018/091479, filed on Jun. 15, 2018, which in turn claims the benefit of priority of Chinese Patent Application No. 201710756443.7, filed on Aug. 29, 2017, the entire disclosures of which Applications are incorporated by reference herein.

TECHNICAL FIELD

Embodiments of the present disclosure relate to the field of display technology, and particularly to a force touch display panel, a detection method thereof, and a display apparatus.

BACKGROUND

With the rapid development of display technology, touch screen panels have gradually spread throughout people's lives. At present, the touch screen panels may be divided into an add-on mode touch panel, an on-cell mode touch panel, and an in-cell mode touch panel according to a constituent structure. Among them, the add-on mode touch panel is a display panel having a touch function, which is formed by separately producing a touch module and a display panel and then bonding them together.

SUMMARY

In accordance with an aspect, embodiments of the present disclosure provide a force touch display panel comprising:
a substrate;
a display structure disposed in a display area on the substrate;
a force common electrode layer, a piezoelectric material layer, and a force sense electrode layer, which are stacked in sequence over the display structure,
wherein the force sense electrode layer comprises a force sense electrode configured for identifying different forces, and the force sense electrode additionally serves as a touch detection electrode configured for identifying a touch operation.

In a possible embodiment, in the force touch display panel according to the embodiment of the present disclosure, the force sense electrode layer comprises a plurality of said force sense electrodes insulated from one another.

In a possible embodiment, the force touch display panel according to the embodiment of the present disclosure further comprises: a first insulating layer disposed between the force common electrode layer and the piezoelectric material layer; and/or a second insulating layer disposed between the piezoelectric material layer and the force sense electrode layer.

In a possible embodiment, in the force touch display panel according to the embodiment of the present disclosure, the display structure is an organic light-emitting diode;
the force touch display panel further comprises: a packaging film disposed over the organic light-emitting diode; and the packaging film is disposed between the organic light-emitting diode and the force common electrode layer; or the packaging film is disposed between the piezoelectric material layer and the force common electrode layer, and the force common electrode layer additionally serves as a common cathode layer of the organic light-emitting diode.

In a possible embodiment, in the force touch display panel according to the embodiment of the present disclosure, the display structure is a liquid crystal display structure;
the force touch display panel further comprises: an opposite substrate disposed over the liquid crystal display structure; and
the opposite substrate is disposed between the liquid crystal display structure and the force common electrode layer; or the opposite substrate is disposed between the piezoelectric material layer and the force common electrode layer, the force common electrode layer additionally serves as a common electrode layer of the liquid crystal display structure, and the common electrode layer is disposed on a side, facing towards the substrate, of the opposite substrate.

In a possible embodiment, in the force touch display panel according to the embodiment of the present disclosure, the piezoelectric material layer is a continuous piezoelectric material layer over the entire substrate.

In a possible embodiment, in the force touch display panel according to the embodiment of the present disclosure, the force common electrode layer is a continuous piezoelectric common electrode layer over the entire substrate.

In a possible embodiment, in the force touch display panel according to the embodiment of the present disclosure, the touch detection electrode is a self-capacitance electrode.

In a possible embodiment, in the force touch display panel according to the embodiment of the present disclosure, the touch detection electrode is a touch sense electrode; and the force common electrode layer comprises a plurality of force common electrodes insulated from one another, and the plurality of force common electrodes additionally serve as touch drive electrodes.

In a possible embodiment, in the force touch display panel according to the embodiment of the present disclosure, the touch detection electrode comprises: a touch sense electrode and a touch drive electrode.

In a possible embodiment, in the force touch display panel according to the embodiment of the present disclosure, the touch detection electrode is a touch sense electrode; and the force touch display panel further comprises: a touch drive electrode layer disposed between the force sense electrode layer and the piezoelectric material layer; and an insulating layer disposed between the touch drive electrode layer and the force sense electrode layer, wherein:
the touch drive electrode layer comprises a plurality of touch drive electrodes insulated from one another.

In a possible embodiment, in the force touch display panel according to the embodiment of the present disclosure, the touch detection electrode is a touch drive electrode;
the force touch display panel further comprises: an insulating layer and a touch sense electrode layer which are stacked in sequence over the force sense electrode layer, wherein:
the touch sense electrode layer comprises a plurality of touch sense electrodes insulated from one another.

In a possible embodiment, in the force touch display panel according to the embodiment of the present disclosure, an optical adhesive layer is disposed between at least two adjacent ones of the force common electrode layer, the piezoelectric material layer and the force sense electrode layer.

In a possible embodiment, in the force touch display panel according to the embodiment of the present disclosure, the force touch display panel further comprises a polarization layer and/or a protective layer.

In a possible embodiment, in the force touch display panel according to the embodiment of the present disclosure, an optical adhesive layer is disposed between at least two adjacent ones of the display structure, the force common electrode layer, the piezoelectric material layer, the force sense electrode layer, the polarization layer and the protective layer.

In accordance with another aspect, embodiments of the present disclosure further provide a detection method of the force touch display panel according to the embodiment of the present disclosure, the detection method comprising:

in a touch detection period, detecting a touched position by the force sense electrode that additionally serves as the touch detection electrode;

in a force detection period, loading a constant electric potential to the force common electrode layer, and detecting a quantity of induced electric charges which are generated by the piezoelectric material layer under the action of a force and which are received by charge coupling by the force sense electrode, thereby detecting a position where the force acts.

In a possible embodiment, in the detection method according to the embodiment of the present disclosure, the touch detection period and the force detection period are a same period.

In a possible embodiment, in the detection method according to the embodiment of the present disclosure, the touch detection period and the force detection period are different periods.

In accordance with a further aspect, embodiments of the present disclosure further provide a display apparatus comprising the force touch display panel according to the embodiment of the present disclosure.

in accordance with still another aspect, embodiments of the present disclosure further provide a method of manufacturing a force touch display panel, the method comprising:

providing a substrate;

forming a display structure in a display area on the substrate;

forming a force common electrode layer, a piezoelectric material layer, and a force sense electrode layer in sequence in a stack over the display structure, wherein the force sense electrode layer comprises a force sense electrode, and the force sense electrode additionally serves as a touch detection electrode.

In a possible embodiment, in the method according to the embodiment of the present disclosure, forming the force common electrode layer, the piezoelectric material layer, and the force sense electrode layer comprises:

forming the piezoelectric material layer directly on the force common electrode layer; and/or forming the force sense electrode layer directly on the piezoelectric material layer.

In a possible embodiment, in the method according to the embodiment of the present disclosure, forming the force common electrode layer, the piezoelectric material layer, and the force sense electrode layer comprises:

forming a force sense structure based on the force common electrode layer and the piezoelectric material layer;

forming a touch structure based on the force sense electrode layer; and bonding the force sense structure and the touch structure by an optical adhesive.

In a possible embodiment, in the method according to the embodiment of the present disclosure, forming the force sense structure comprises bonding at least two adjacent layers of the force sense structure by an optical adhesive.

In a possible embodiment, in the method according to the embodiment of the present disclosure, forming the touch structure comprises bonding at least two adjacent layers of the touch structure by an optical adhesive.

In a possible embodiment, in the method according to the embodiment of the present disclosure, the force sense structure comprises the force common electrode layer, the piezoelectric material layer, an insulating layer, a polyester film and/or an optical adhesive layer.

In a possible embodiment, in the method according to the embodiment of the present disclosure, the touch structure comprises the force sense electrode layer, an insulating layer, a polarization layer and/or an optical adhesive layer.

In a possible embodiment, in the method according to the embodiment of the present disclosure, the method further comprises forming a protective layer over the touch structure.

DETAILED DESCRIPTION

Figure 1A:
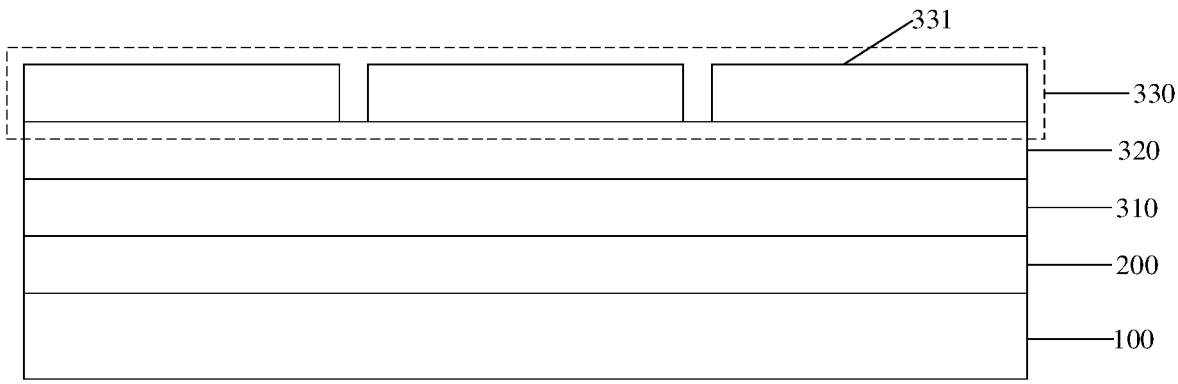
FIGS. 1$a$-1$d$ are schematic views showing structures of force touch display panels according to embodiments of the present disclosure, respectively.

A force touch display panel, a detection method thereof, and a display apparatus will be described in detail as below with reference to embodiments of the present disclosure taken in conjunction with the accompanying drawings.

In the drawings, all of thicknesses, shapes and sizes of films do not reflect a real scale of the force touch display panel, and the only purpose is to schematically show contents of the present disclosure.

Generally, a touch component in a touch screen can detect only two-dimensional coordinates. In other words, the touch component can detect only touch positions of a finger in x and y directions on a surface of the touch screen, and cannot detect a force in a z direction perpendicular to the surface of the touch screen when the finger presses the screen.

Embodiments of the present disclosure provide a force touch display panel, a detection method thereof, and a display apparatus, thereby achieving a three-dimensional detection of the touch display panel.

As shown in FIGS. 1a-1d, a force touch display panel according to the embodiments of the present disclosure includes: a substrate 100; and a plurality of display structures 200 disposed in a display area on the substrate 100; a force common electrode layer 310, a piezoelectric material layer 320, and a force sense electrode layer 330, which are stacked in sequence on the display structures 200.

The force sense electrode layer 330 is constituted by a plurality of force sense electrodes 331 insulated from one another, and the force sense electrodes 331 additionally serve as touch detection electrodes.

Specifically, in the force touch display panel according to the embodiments of the present disclosure, induced electric charges are generated by the piezoelectric material layer 320 under the action of a force, and the induced electric charges can be received by charge coupling by the force sense electrodes 331, thereby achieving a force sense function in a force detection period. A touch detection function can be achieved by the force sense electrodes 331 additionally serving as the touch detection electrodes in a touch period. Therefore, the touch detection function and the force sense function can be achieved in the display panel.

Specifically, in the force touch display panel according to the embodiments of the present disclosure, a force sense structure is constituted by the three layers, i.e. the force common electrode layer 310, the piezoelectric material layer 320 and the force sense electrode layer 330. The three layers may not constitute a structure in which all of them are in direct contact with one another. In other words, they may be separated by one or two insulating material layers.

Figure 1B:
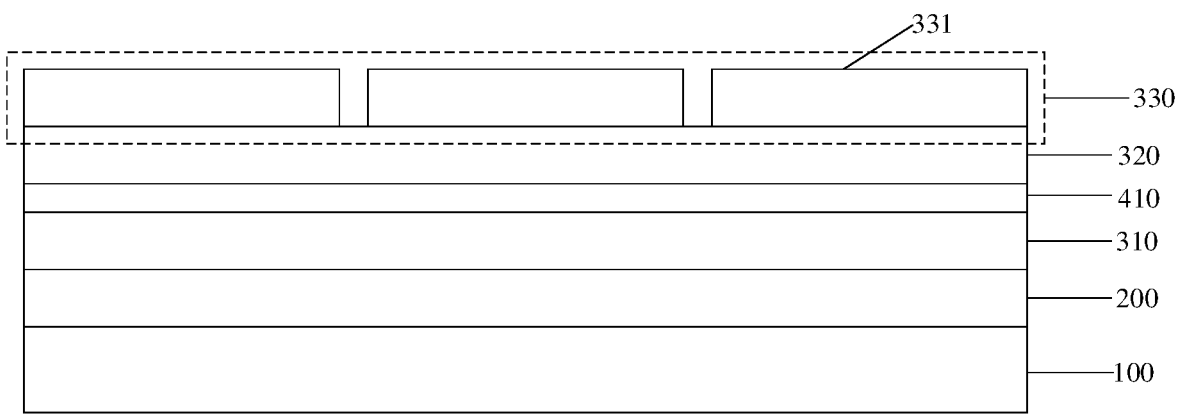

For example, as shown in FIG. 1b, a first insulating layer 410 may be inserted between the force common electrode layer 310 and the piezoelectric material layer 320. In this case, the piezoelectric material layer 320 and the force sense electrode layer 330 are in direct contact with each other. When a force acts on the force sense structure, polarization charges are generated at an upper surface and a lower surface of the piezoelectric material layer 320. The polarization charges are released to the force common electrode layer 310 by non-contact charge coupling, the polarization charges are released to the force sense electrode layer 330 by contact charge coupling, and the force sense electrode 331 obtains information about the force according to a quantity of the received coupled electric charges.

Figure 1C:
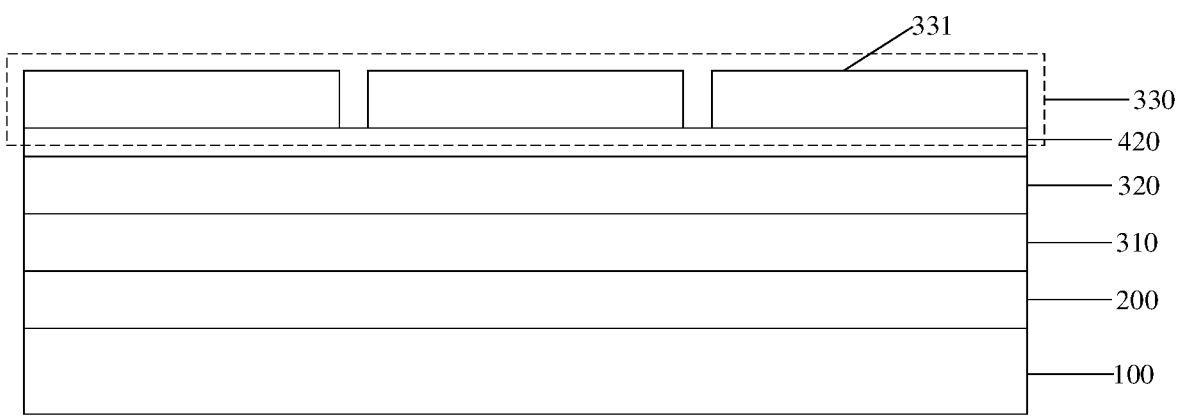

In addition, for example, as shown in FIG. 1c, a second insulating layer 420 may be inserted between the piezoelectric material layer 320 and the force sense electrode layer 330. In this case, the force common electrode layer 310 and the piezoelectric material layer 320 are in direct contact with each other. When a force acts on the force sense structure, polarization charges are generated at an upper surface and a lower surface of the piezoelectric material layer 320. The polarization charges are released to the force common electrode layer 310 by contact charge coupling, the polarization charges are released to the force sense electrode layer 330 by non-contact charge coupling, and the force sense electrode 331 obtains information about the force according to a quantity of the received coupled electric charges.

Figure 1D:
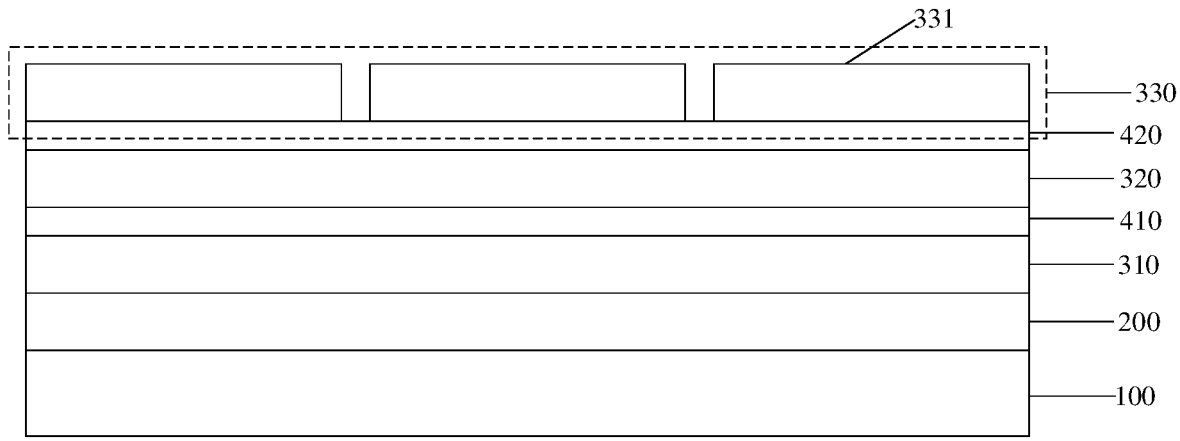

In addition, for example, as shown in FIG. 1d, a first insulating layer 410 may be inserted between the force common electrode layer 310 and the piezoelectric material layer 320, and a second insulating layer 420 may be inserted between the piezoelectric material layer 320 and the force sense electrode layer 330. When a force acts on the force sense structure, polarization charges are generated at an upper surface and a lower surface of the piezoelectric material layer 320. The polarization charges are released to the force common electrode layer 310 and the force sense electrode layer 330 by non-contact charge coupling, and the force sense electrode 331 obtains information about the force according to a quantity of the received coupled electric charges.

Based on the above structure, in the force touch display panel according to the embodiments of the present disclosure, induced electric charges generated by the piezoelectric material layer 320 under the action of a force can be received by non-contact charge coupling by the force sense electrodes 331, thereby achieving a force sense function. Therefore, with the force touch display panel according to the embodiments of the present disclosure, a force touch display panel of a simplest structure can be achieved by substituting or inserting the piezoelectric material layer 320 at some films based on a general touch display panel.

In a specific implementation, in the case where the force touch display panel according to the embodiments of the present disclosure is based on a general touch organic light-emitting diode display panel, as shown in FIGS. 2a-2j, the display structure 200 may be specifically an organic light-emitting diode OLED. The force touch display panel may further include: a packaging film 500 disposed over the organic light-emitting diode OLED. As shown in FIGS. 2a-2e, the packaging film 500 may be disposed between the organic light-emitting diode OLED and the force common electrode layer 310. In other words, the force sense structure may be disposed on an outer side of the packaging film 500. Alternatively, as shown in FIGS. 2f-2j, the packaging film 500 may also be disposed between the piezoelectric material layer 320 and the force common electrode layer 310. In other words, the packaging film 500 serves as an insulating material layer between the piezoelectric material layer 320 and the force common electrode layer 310. In this case, in order to simplify a structure of films of the force touch display panel, the force common electrode layer 310 may additionally serve as a common cathode layer of the organic light-emitting diode OLED.

In a specific implementation, in the case where the force touch display panel according to the embodiments of the present disclosure is based on a general liquid crystal display panel, as shown in FIGS. 3a-3j, the display structure 200 may also be specifically a liquid crystal display structure LCD. The force touch display panel may further include: an opposite substrate 600 disposed over the liquid crystal display structure LCD. As shown in FIGS. 3a-3e, the opposite substrate 600 may be disposed between the liquid crystal display structure LCD and the force common electrode layer 310. In other words, the force sense structure may be disposed on an outer side of the opposite substrate 600. Alternatively, as shown in FIGS. 3f-3j, the opposite substrate 600 may also be disposed between the piezoelectric material layer 320 and the force common electrode layer 310. In other words, the opposite substrate 600 serves as an insulating material layer between the piezoelectric material layer 320 and the force common electrode layer 310. In this case, in order to simplify a structure of films of the force touch display panel, the force common electrode layer 310 may additionally serve as a common electrode layer of the liquid crystal display structure. In other words, the common electrode layer is disposed on a side, facing towards the substrate 100, of the opposite substrate 600.

In a specific implementation, in the force touch display panel according to the embodiments of the present disclosure, as shown in FIGS. 1a-1d, the piezoelectric material layer 320 may be a piezoelectric material layer 320 disposed as one complete layer, so that a process of patterning the piezoelectric material layer 320 can be eliminated, a manufacturing procedure can be simplified and a manufacturing efficiency is improved. Of course, the piezoelectric material layer 320 may also be patterned to have the same pattern as the force sense electrode layer 330. In this way, the same mask may be used to manufacture the pattern of the piezoelectric material layer 320 and the pattern of the force sense electrode layer 330, so that a production cost may also be saved.

In a specific implementation, in the force touch display panel according to the embodiments of the present disclosure, as shown in FIGS. 1a-1d, generally the force common electrode layer 310 may also be a force common electrode layer 310 disposed as one complete layer, so that a process of patterning the force common electrode layer 310 can be eliminated, a manufacturing procedure can be simplified and a manufacturing efficiency is improved. Of course, the force common electrode layer 310 may also be patterned, for example, to have the same pattern as the force sense electrode layer 330. In this way, the same mask may be used to manufacture the pattern of the force common electrode layer 310 and the pattern of the force sense electrode layer 330, so that a production cost may also be saved. Alternatively, the force common electrode layer 310 may also be designed to have a different pattern according to requirements, and there is no limitation on the pattern of the force common electrode layer herein.

Specific structures in which the force sense electrodes 331 additionally serve as the touch detection electrodes in the force touch display panel according to the embodiments of the present disclosure will be described in detail as below with several specific embodiments.

In a specific implementation, in the force touch display panel according to the embodiments of the present disclosure, as shown in FIGS. 2a, 2f, 3a and 3f, the touch detection electrode may be specifically a self-capacitance electrode Cm, a self-capacitance touch detection function is achieved by the force sense electrodes 331, and a force detection function is achieved by a force sense structure constituted by three layers, i.e. the force common electrode layer 310, the piezoelectric material layer 320 and the force sense electrode layer 330.

In this case, in order that the force sense electrodes 331 achieve a function of additionally serving as the self-capacitance electrodes Cm, the force sense electrodes 331 are generally blocky electrodes. In other words, the force sense electrode layer 330 is divided into a plurality of force sense electrodes 331 arranged in an array. Specifically, the force sense electrodes 331 may be a mesh-shaped structure to avoid a light emitting region of the organic light-emitting diode OLED. The force sense electrodes 331 may also be non-mesh-shaped transparent electrodes.

Figure 2A:
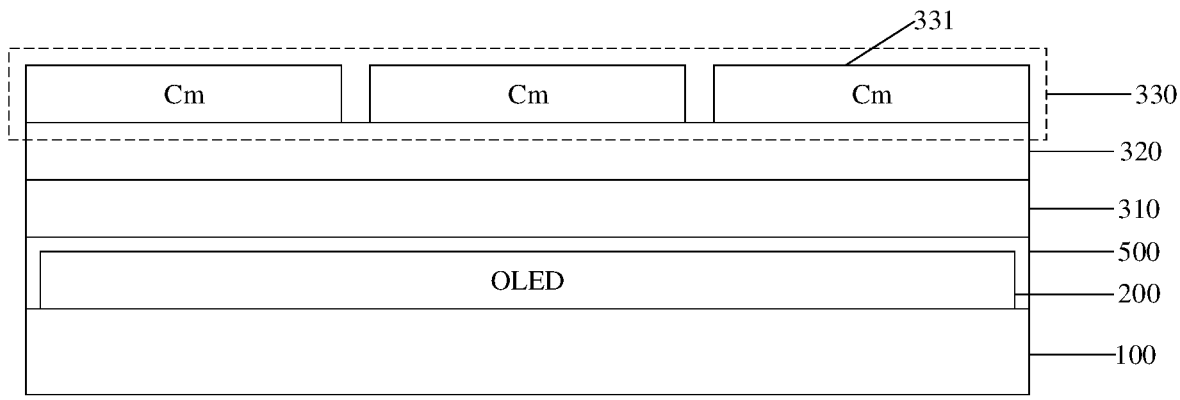
FIGS. 2$a$-2$j$ are schematic views showing structures of force touch display panels according to embodiments of the present disclosure, respectively, in which each of the force touch display panels is applied to an organic light-emitting diode display panel.

Specifically, in the case where the force touch display panel according to the present embodiment is based on a general touch organic light-emitting diode display panel, as shown in FIG. 2a, the force common electrode layer 310, the piezoelectric material layer 320, and an array of the force sense electrodes 331 may be manufactured in sequence on the packaging film 500. Alternatively, as shown in FIG. 2f, the common cathode layer of the organic light-emitting diode OLED may be utilized to additionally serve as the force common electrode layer 310. Then, the piezoelectric material layer 320 and the array of the force sense electrodes 331 are manufactured in sequence on the packaging film 500.

Figure 3A:
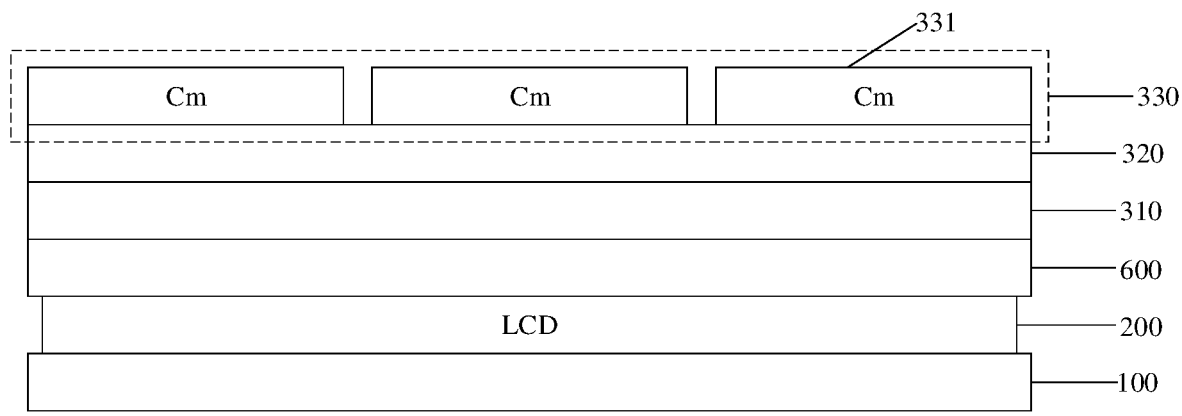
FIGS. 3$a$-3$j$ are schematic views showing structures of force touch display panels according to embodiments of the present disclosure, respectively, in which each of the force touch display panels is applied to a liquid crystal display panel.

Specifically, in the case where the force touch display panel according to the present embodiment is based on a general touch liquid crystal display panel, as shown in FIG. 3a, the force common electrode layer 310, the piezoelectric material layer 320, and the array of the force sense electrodes 331 may be manufactured in sequence on a back surface of the opposite substrate 600. Alternatively, as shown in FIG. 3f, a common electrode layer disposed on an inner side of the opposite substrate 600 may be utilized to additionally serve as the force common electrode layer 310. Then, the piezoelectric material layer 320 and the array of the force sense electrodes 331 are manufactured in sequence on the back surface of the opposite substrate 600.

With the structure in which the force sense electrodes 331 additionally serve as the self-capacitance electrodes Cm, according to the embodiment, a time-sharing drive may be used for a touch detection and a force detection, or a simultaneous drive may also be used for the touch detection and the force detection, the force sense electrodes 331 receive a force signal and a touch signal simultaneously, and the force signal and the touch signal may be separated in a back-end processing circuit.

In a specific implementation, in the force touch display panel according to the embodiments of the present disclosure, as shown in FIGS. 2b, 2g, 3b and 3g, the touch detection electrode may be specifically a touch sense electrode Rx. In this case, in order to simplify a structure of films of the force touch display panel, the force common electrode layer 310 may be used to additionally serve as the touch drive electrodes Tx to achieve a function of the touch drive electrodes. Specifically, the force common electrode layer 310 may be constituted by a plurality of force common electrodes 311 insulated from one another, and the plurality of force common electrodes 311 additionally serve as the touch drive electrodes Tx. This is equivalent to a substitution of the piezoelectric material layer 320 for a dielectric layer which is located between touch drive electrodes Tx and touch sense electrodes Rx for a mutual capacitance detection. A touch detection function is achieved by the force sense electrodes 331 and the force common electrodes 311, and a force detection function is achieved by a force sense structure constituted by the three layers, i.e. the force common electrode layer 310, the piezoelectric material layer 320 and the force sense electrode layer 330.

In this case, in order that the force sense electrodes 331 and the force common electrodes 311 achieve the touch detection function, the force sense electrodes 331 and the force common electrodes 311 are generally strip-shaped electrodes crossing each other. In other words, the force sense electrode layer 330 is divided into a plurality of strip-shaped force sense electrodes 331, and the force common electrode layer 310 is divided into a plurality of strip-shaped force common electrodes 311.

Figure 2B:
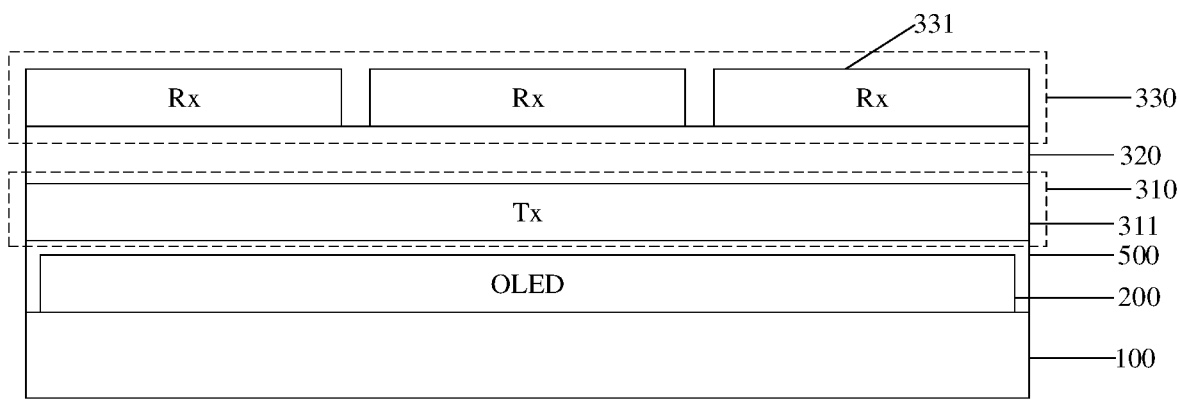

Specifically, in the case where the force touch display panel according to the present embodiment is based on the general touch organic light-emitting diode display panel, as shown in FIG. 2b, the force common electrode layer 310, the piezoelectric material layer 320, and the force sense electrode layer 330 may be manufactured in sequence on the packaging film 500. Or, as shown in FIG. 2g, the common cathode layer of the organic light-emitting diode OLED may be utilized to additionally serve as the force common electrode layer 310. Then, the piezoelectric material layer 320 and the force sense electrode layer 330 are manufactured in sequence on the packaging film 500.

Figure 3B:
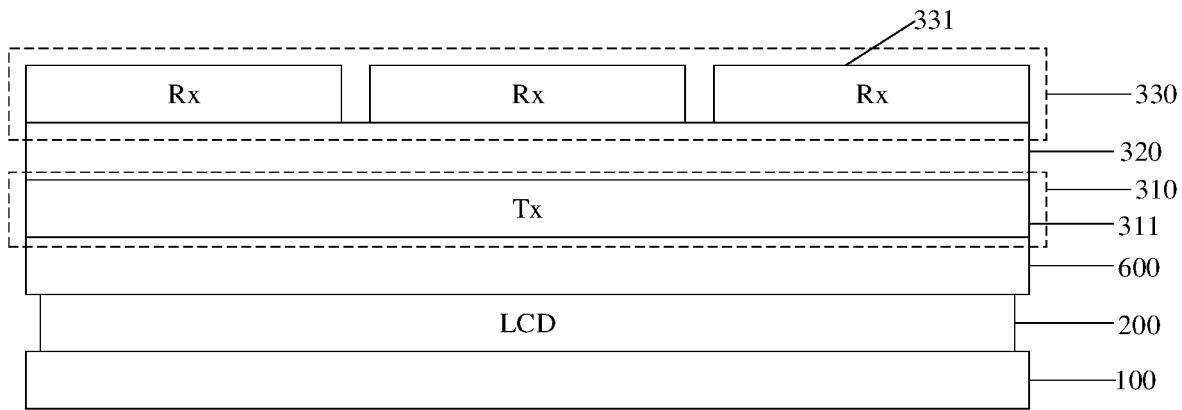

Specifically, in the case where the force touch display panel according to the present embodiment is based on the general touch liquid crystal display panel, as shown in FIG. 3b, the force common electrode layer 310, the piezoelectric material layer 320, and the force sense electrode layer 330 may be manufactured in sequence on the back surface of the opposite substrate 600. Or, as shown in FIG. 3g, the common electrode layer disposed on the inner side of the opposite substrate 600 may be utilized to additionally serve as the force common electrode layer 310 by being divided. Then, the piezoelectric material layer 320 and the force sense electrode layer 330 are manufactured in sequence on the back surface of the opposite substrate 600.

With the structure in which the force sense electrodes 331 additionally serve as the touch sense electrodes Rx and the force common electrodes 311 additionally serve as the touch drive electrodes Tx, according to the embodiment, the time-sharing drive may be used for the touch detection and the force detection, or the simultaneous drive may also be used for the touch detection and the force detection, the force sense electrodes 331 receive the force signal and the touch signal simultaneously, and the force signal and the touch signal may be separated in the back-end processing circuit.

In a specific implementation, in the force touch display panel according to the embodiments of the present disclosure, as shown in FIGS. 2c, 2h, 3c and 3h, the touch detection electrode may specifically include: a touch sense electrode Rx and a touch drive electrode Tx. A mutual-capacitance touch detection function is achieved by the force sense electrodes 331, and the force detection function is achieved by the force sense structure constituted by the three layers, i.e. the force common electrode layer 310, the piezoelectric material layer 320 and the force sense electrode layer 330.

In this case, in order that each of the force sense electrodes 331 achieves a function of additionally serving as the touch sense electrode Rx and the touch drive electrode Tx, the force sense electrodes 331 are generally blocky electrodes. In other words, the force sense electrode layer 330 is divided into the plurality of force sense electrodes 331 arranged in an array. Then, the touch sense electrode Rx or the touch drive electrode Tx is formed by bridging.

Figure 2C:
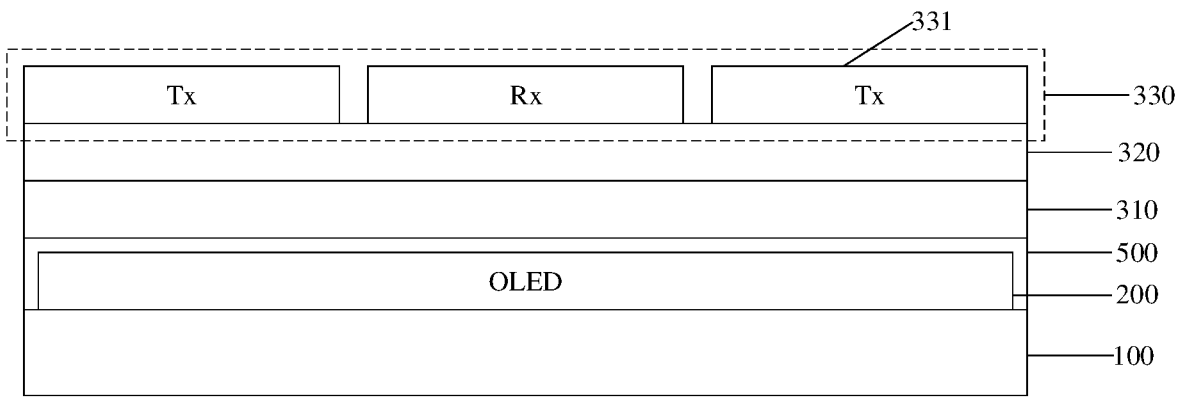

Specifically, in the case where the force touch display panel according to the present embodiment is based on the general touch organic light-emitting diode display panel, as shown in FIG. 2c, the force common electrode layer 310, the piezoelectric material layer 320, and an array of the force sense electrodes 331 may be manufactured in sequence on the packaging film 500. Or, as shown in FIG. 2h, the common cathode layer of the organic light-emitting diode OLED may be utilized to additionally serve as the force common electrode layer 310. Then, the piezoelectric material layer 320 and the array of the force sense electrodes 331 are manufactured in sequence on the packaging film 500.

Figure 3C:
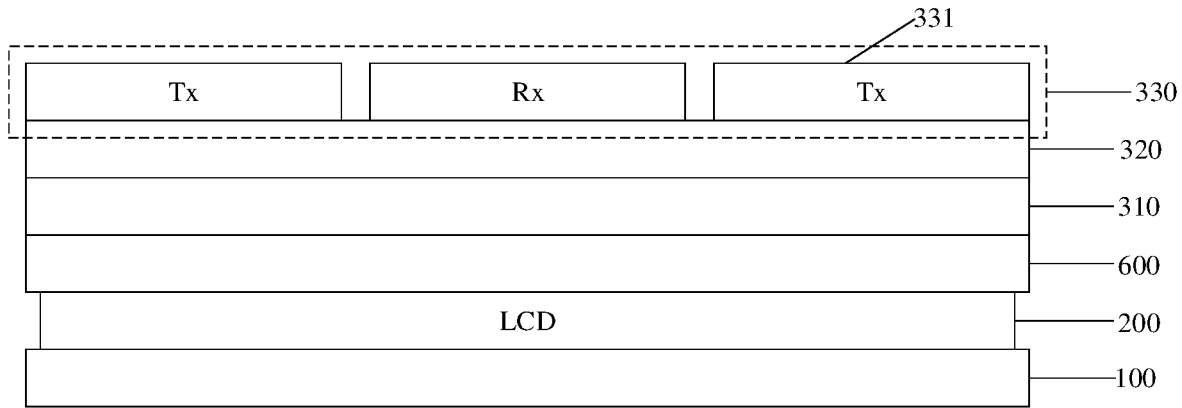

Specifically, in the case where the force touch display panel according to the present embodiment is based on the general touch liquid crystal display panel, as shown in FIG. 3c, the force common electrode layer 310, the piezoelectric material layer 320, and the array of the force sense electrodes 331 may be manufactured in sequence on a back surface of the opposite substrate 600. Or, as shown in FIG. 3h, the common electrode layer disposed on the inner side of the opposite substrate 600 may be utilized to additionally serve as the force common electrode layer 310. Then, the piezoelectric material layer 320 and the array of the force sense electrodes 331 are manufactured in sequence on the back surface of the opposite substrate 600.

With the structure in which the force sense electrodes 331 additionally serve as the touch sense electrode Rx and the touch drive electrode Tx, according to the embodiment, the time-sharing drive may be used for the touch detection and the force detection, or the simultaneous drive may also be used for the touch detection and the force detection, the force sense electrodes 331 receive the force signal and the touch signal simultaneously, and the force signal and the touch signal may be separated in the back-end processing circuit.

In a specific implementation, in the force touch display panel according to the embodiments of the present disclosure, as shown in FIGS. 2d, 2i, 3d and 3i, the touch detection electrode may be specifically the touch sense electrode Rx. In this case, the force touch display panel may further include: a touch drive electrode layer 700 disposed between the force sense electrode layer 330 and the piezoelectric material layer 320; and an insulating layer 800 disposed between the touch drive electrode layer 700 and the force sense electrode layer 330. The touch drive electrode layer 700 is constituted by a plurality of touch drive electrodes Tx insulated from one another. The touch detection function is achieved by the force sense electrodes 331 and the touch drive electrodes Tx, and the force detection function is achieved by the force sense structure constituted by the three layers, i.e. the force common electrode layer 310, the piezoelectric material layer 320 and the force sense electrode layer 330.

In this case, in order that the force sense electrodes 331 and the touch drive electrodes Tx achieve the touch detection function, the force sense electrodes 331 and the touch drive electrodes Tx are generally strip-shaped electrodes crossing each other. In other words, the force sense electrode layer 330 is divided into the plurality of strip-shaped force sense electrodes 331, and the touch drive electrode layer 700 is divided into a plurality of strip-shaped touch drive electrodes Tx.

Figure 2D:
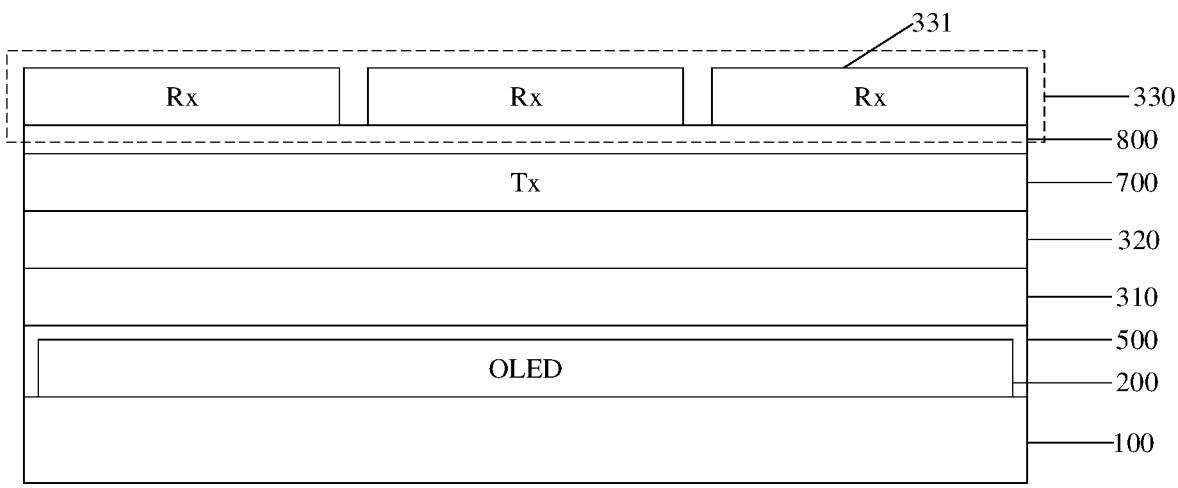

Specifically, in the case where the force touch display panel according to the present embodiment is based on the general touch organic light-emitting diode display panel, as shown in FIG. 2d, the force common electrode layer 310, the piezoelectric material layer 320, the touch drive electrode layer 700, an insulating layer 800, and the force sense electrode layer 330 may be manufactured in sequence on the packaging film 500. Or, as shown in FIG. 2i, the common cathode layer of the organic light-emitting diode OLED may be utilized to additionally serve as the force common electrode layer 310. Then, the piezoelectric material layer 320, the touch drive electrode layer 700, the insulating layer 800, and the force sense electrode layer 330 are manufactured in sequence on the packaging film 500.

Figure 3D:
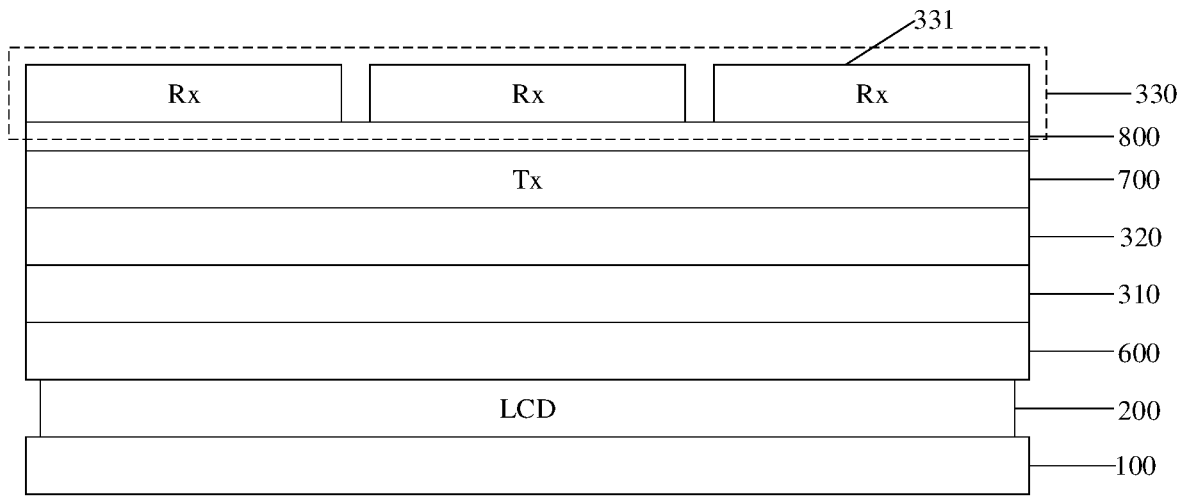

Specifically, in the case where the force touch display panel according to the present embodiment is based on the general touch liquid crystal display panel, as shown in FIG. 3d, the force common electrode layer 310, the piezoelectric material layer 320, the touch drive electrode layer 700, the insulating layer 800, and the force sense electrode layer 330 may be manufactured in sequence on the back surface of the opposite substrate 600. Or, as shown in FIG. 3i, the common electrode layer disposed on the inner side of the opposite substrate 600 may be utilized to additionally serve as the force common electrode layer 310. Then, the piezoelectric material layer 320, the touch drive electrode layer 700, the insulating layer 800, and the force sense electrode layer 330 are manufactured in sequence on the back surface of the opposite substrate 600.

With the structure in which the force sense electrodes 331 additionally serve as the touch sense electrode Rx, according to the embodiment, the time-sharing drive may be used for the touch detection and the force detection, or the simultaneous drive may also be used for the touch detection and the force detection, the force sense electrodes 331 receive the force signal and the touch signal simultaneously, and the force signal and the touch signal may be separated in the back-end processing circuit.

In a specific implementation, in the force touch display panel according to the embodiments of the present disclosure, as shown in FIGS. 2e, 2j, 3e and 3j, the touch detection electrode may be specifically the touch drive electrode Tx. In this case, the force touch display panel may further include: an insulating layer 800 and a touch sense electrode layer 900 which are stacked in sequence on the force sense electrode layer 330. The touch sense electrode layer 900 is constituted by a plurality of touch sense electrodes Rx insulated from one another. The touch detection function is achieved by the force sense electrodes 331 and the touch sense electrodes Rx, and the force detection function is achieved by the force sense structure constituted by the three layers, i.e. the force common electrode layer 310, the piezoelectric material layer 320 and the force sense electrode layer 330.

In this case, in order that the force sense electrodes 331 and the touch sense electrodes Rx achieve the touch detection function, the force sense electrodes 331 and the touch sense electrodes Rx are generally strip-shaped electrodes crossing each other. In other words, the force sense electrode layer 330 is divided into the plurality of strip-shaped force sense electrodes 331, and the touch sense electrode layer 900 is divided into a plurality of strip-shaped touch sense electrodes Rx.

Figure 2E:
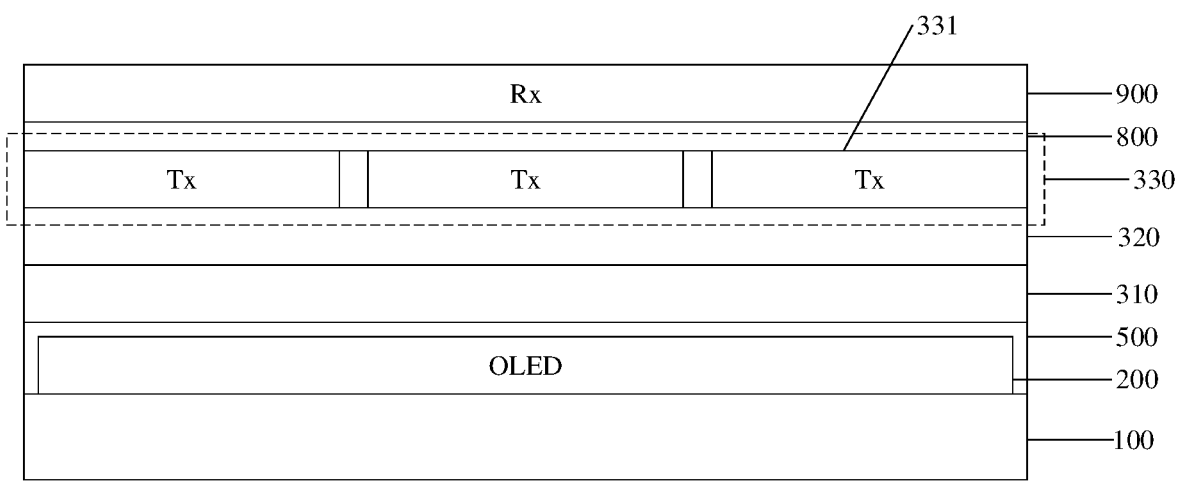
Figure 2F:
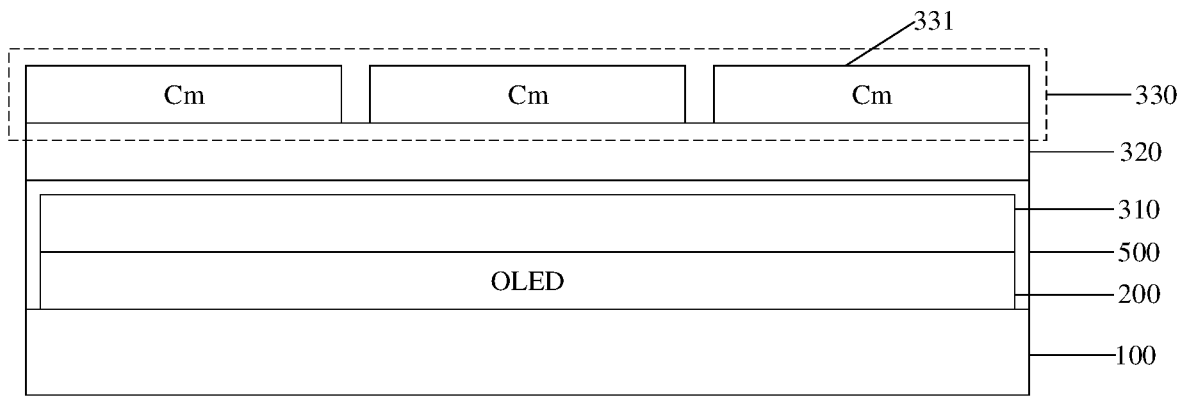
Figure 2G:
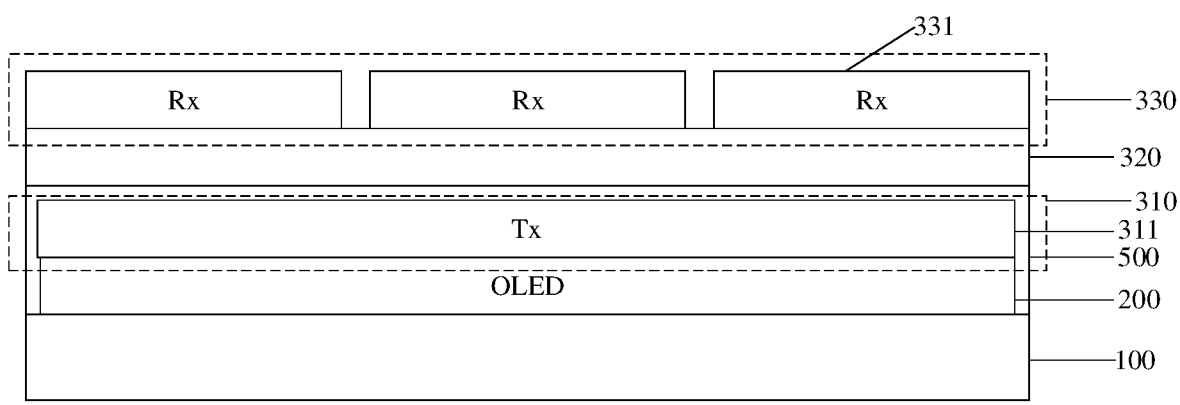
Figure 2H:
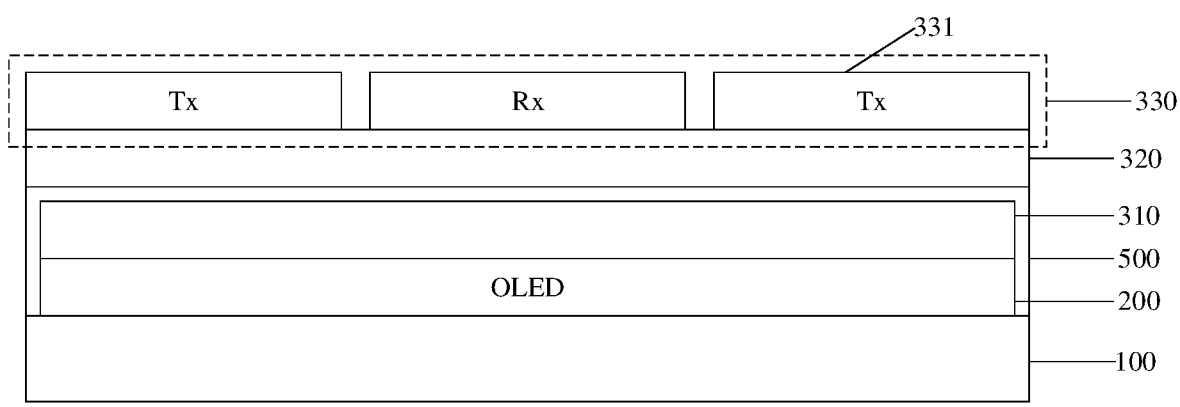
Figure 2I:
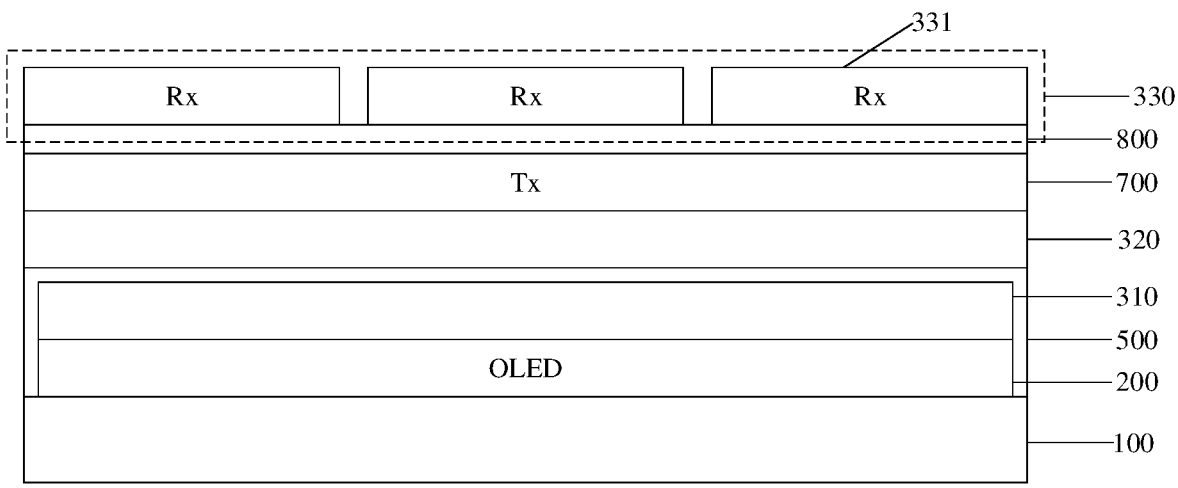
Figure 2J:
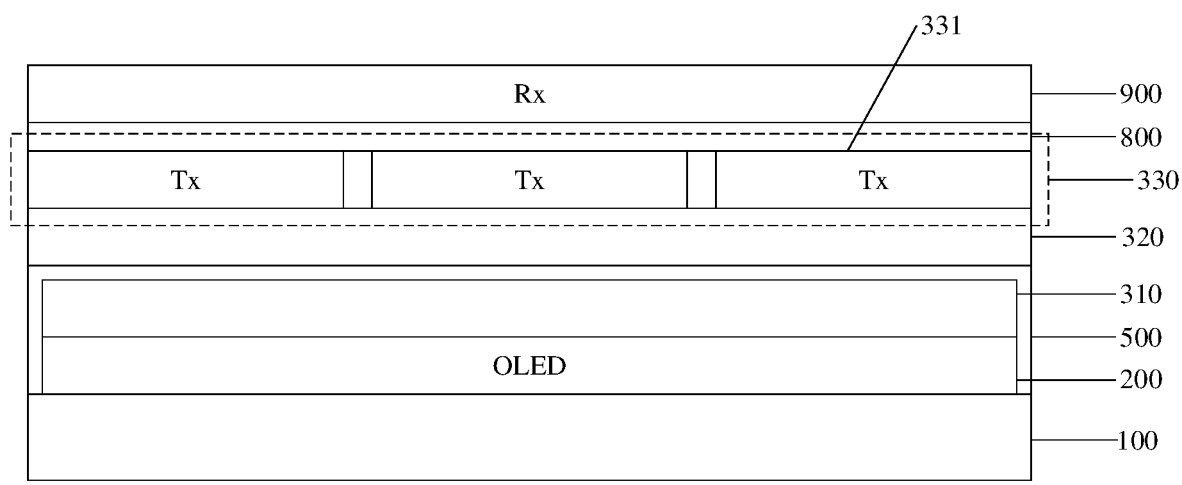

Specifically, in the case where the force touch display panel according to the present embodiment is based on the general touch organic light-emitting diode display panel, as shown in FIG. 2e, the force common electrode layer 310, the piezoelectric material layer 320, the force sense electrode layer 330, the insulating layer 800, and the touch sense electrode layer 900 may be manufactured in sequence on the packaging film 500. Or, as shown in FIG. 2j, the common cathode layer of the organic light-emitting diode OLED may be utilized to additionally serve as the force common electrode layer 310. Then, the piezoelectric material layer 320, the force sense electrode layer 330, the insulating layer 800, and the touch sense electrode layer 900 are manufactured in sequence on the packaging film 500.

Figure 3E:
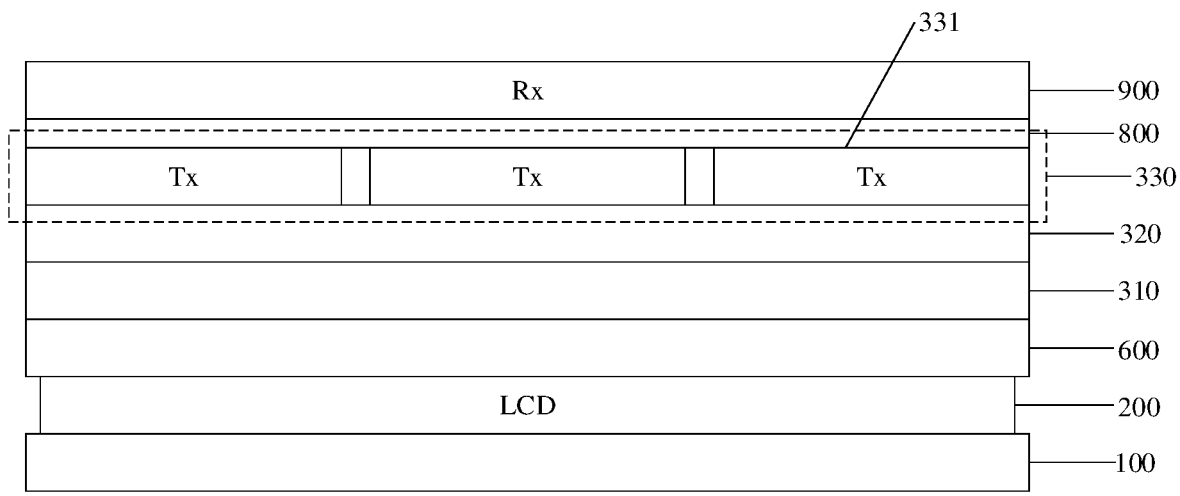
Figure 3F:
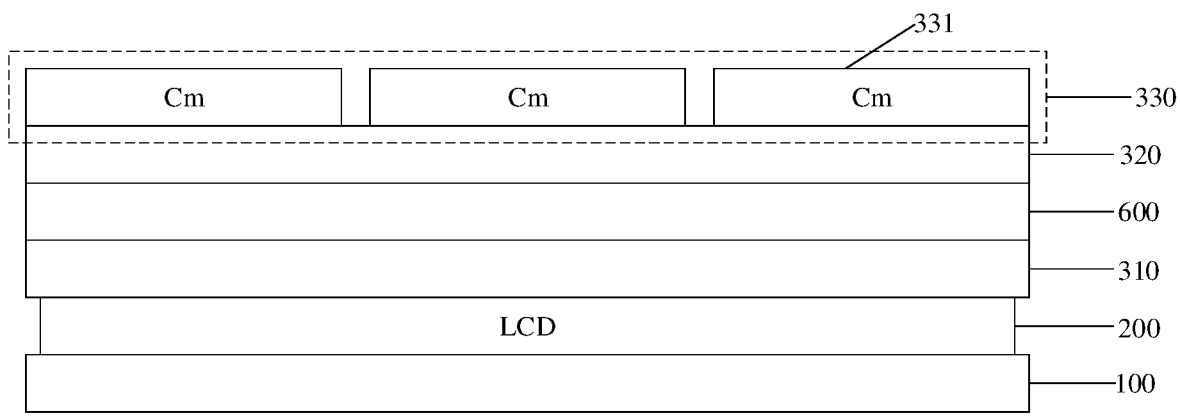
Figure 3G:
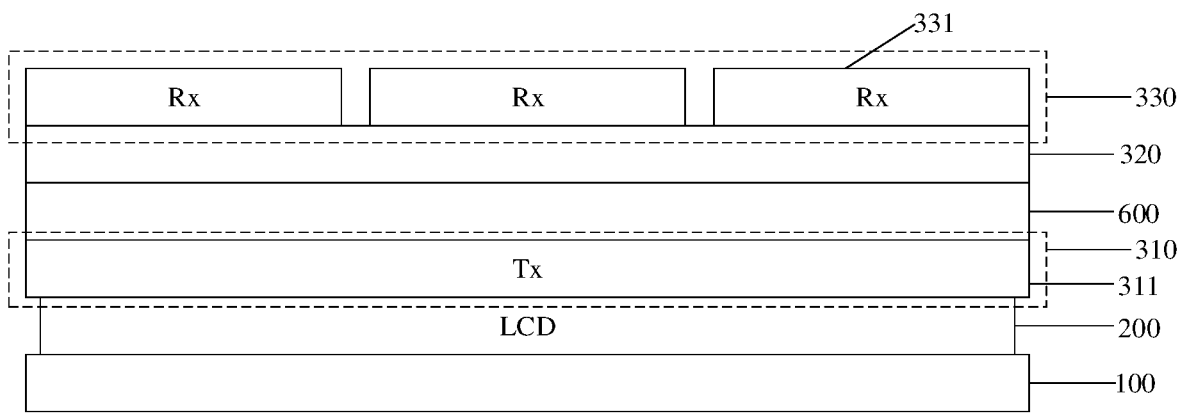
Figure 3H:
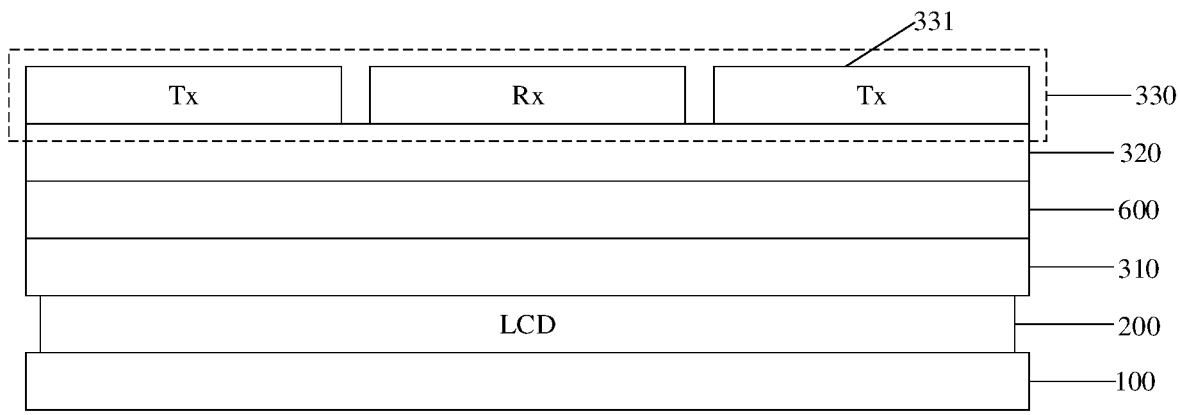
Figure 3I:
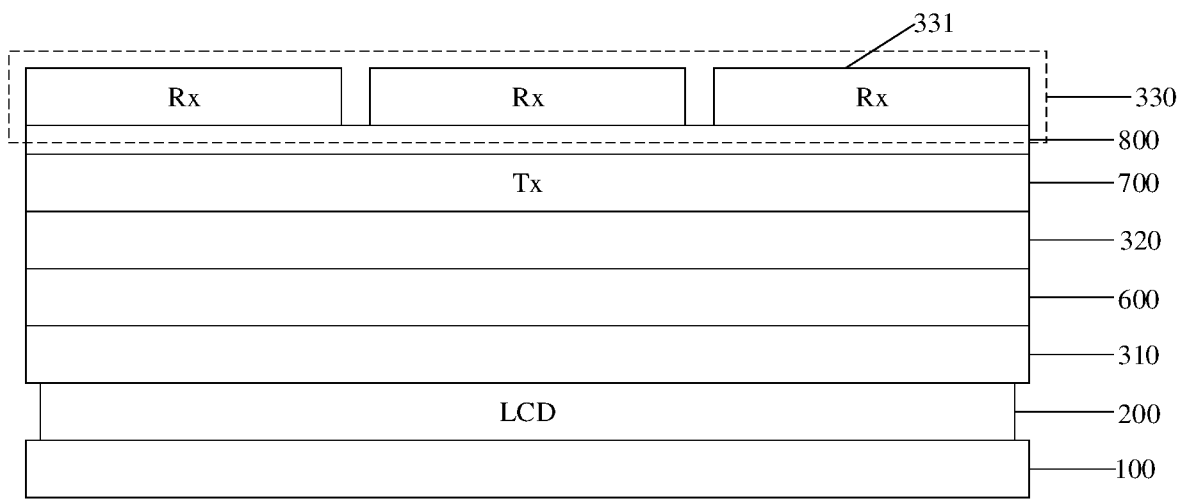
Figure 3J:
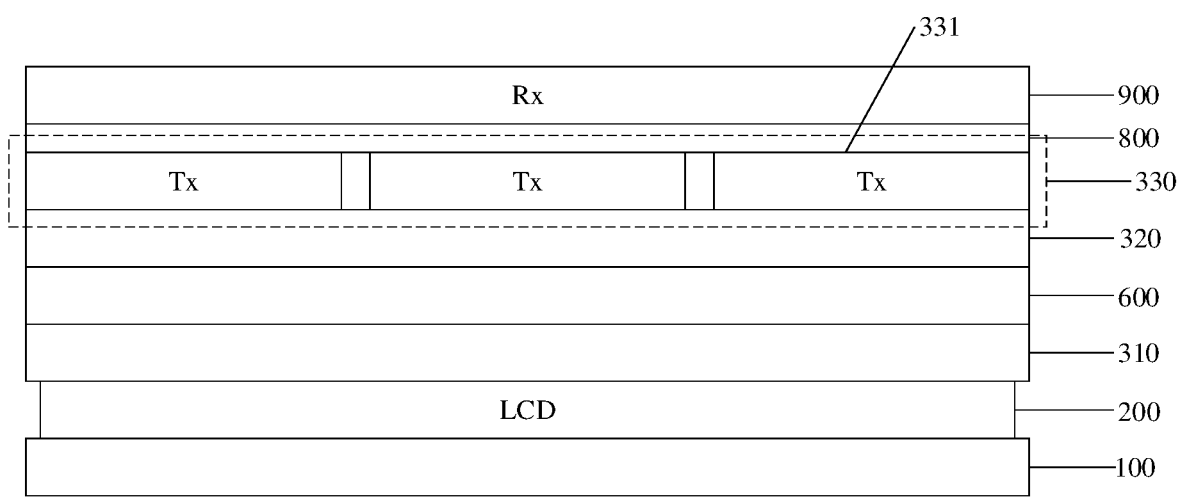

Specifically, in the case where the force touch display panel according to the present embodiment is based on the general touch liquid crystal display panel, as shown in FIG. 3e, the force common electrode layer 310, the piezoelectric material layer 320, the force sense electrode layer 330, the insulating layer 800, and the touch sense electrode layer 900 may be manufactured in sequence on the back surface of the opposite substrate 600. Or, as shown in FIG. 3j, the common electrode layer disposed on the inner side of the opposite substrate 600 may be utilized to additionally serve as the force common electrode layer 310. Then, the piezoelectric material layer 320, the force sense electrode layer 330, the insulating layer 800, and the touch sense electrode layer 900 are manufactured in sequence on the back surface of the opposite substrate 600.

With the structure in which the force sense electrodes 331 additionally serve as the touch drive electrodes Tx, according to the embodiment, the time-sharing drive may be used for the touch detection and the force detection, or the simultaneous drive may also be used for the touch detection and the force detection, the force sense electrodes 331 receive the force signal and the touch signal simultaneously, and the force signal and the touch signal may be separated in the back-end processing circuit.

Based on the same inventive concept, embodiments of the present disclosure further provide a detection method of the force touch display panel. Since principles of the detection method for solving a problem are similar to those of the force touch display panel, the implementations of the force touch display panel may be referred to for implementations of the detection method, and repeated contents are no longer described for the sake of brevity.

Figure 4:
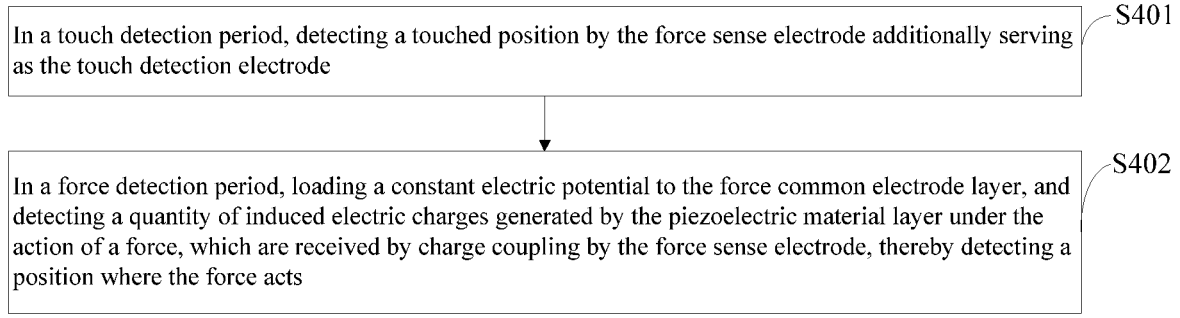
FIG. 4 is a schematic flow diagram of a detection method of a force touch display panel according to an embodiment of the present disclosure.

Specifically, as shown in FIG. 4, a detection method of the force touch display panel according to the embodiment of the present disclosure includes:

a step S401 of in a touch detection period, detecting a touched position by the force sense electrode additionally serving as the touch detection electrode;

a step S402 of in a force detection period, loading a constant electric potential to the force common electrode layer, and detecting a quantity of induced electric charges generated by the piezoelectric material layer under the action of a force, which are received by charge coupling by the force sense electrode, thereby detecting a position where the force acts.

In a specific implementation, in the detection method according to the embodiment of the present disclosure, the touch detection period and the force detection period may be the same period. The force sense electrodes receive the force signal and the touch signal simultaneously, and the force signal and the touch signal may be separated in the back-end processing circuit.

In a specific implementation, in the detection method according to the embodiment of the present disclosure, the touch detection period and the force detection period may also be different periods.

FIGS. 5-8 show several examples of the force touch display panel. These examples are will be described in the case where the force touch display panel is based on a touch organic light-emitting diode display panel. The display structure 200 is specifically an organic light-emitting diode OLED. It is to be noted that the force touch display panels may also be based on a liquid crystal display panel, and accordingly the display structure 200 is specifically a liquid crystal display structure LCD.

Figure 5:
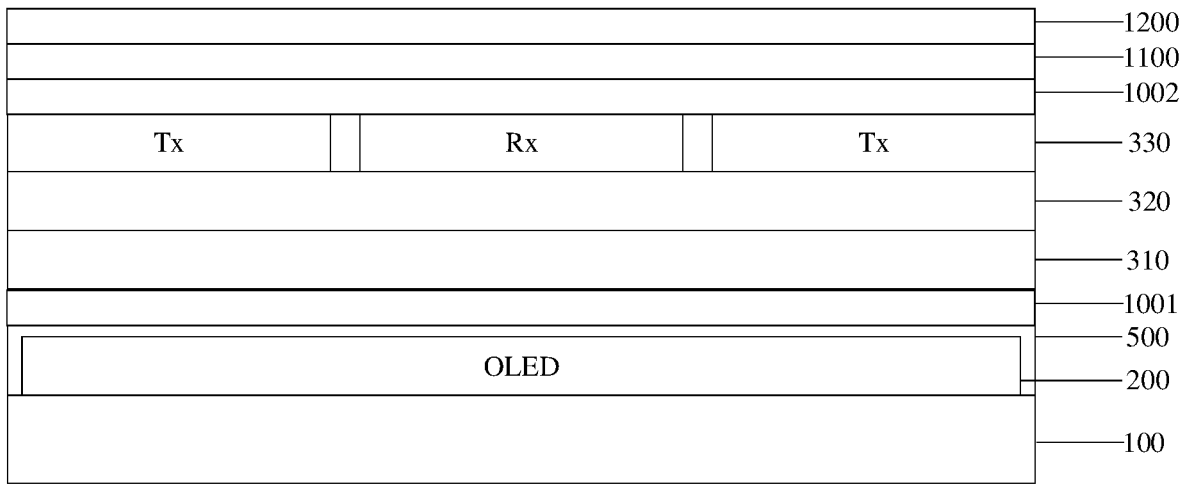
FIG. 5 is a schematic view showing a structure of a force touch display panel according to an embodiment of the present disclosure.

In the embodiment shown in FIG. 5, the force touch display panel includes: a substrate 100; a plurality of OLED display structures 200 disposed in a display area on the substrate 100; a packaging film 500 disposed on the organic light-emitting diodes OLED; a first optical adhesive layer 1001 disposed on the packaging film 500; a force common electrode layer 310, a piezoelectric material layer 320, and a force sense electrode layer 330, which are stacked in sequence on the first optical adhesive layer 1001; a second optical adhesive layer 1002 disposed on the force sense electrode layer 330; a polarization layer 1100 disposed on the second optical adhesive layer 1002; and a protective layer 1200 disposed on the polarization layer 1100.

Here, the force sense electrode layer 330 is constituted by a plurality of force sense electrodes insulated from one another, and the force sense electrodes additionally serve as touch detection electrodes. Specifically, in the force touch display panel according to the embodiments of the present disclosure, induced electric charges are generated by the piezoelectric material layer 320 under the action of a force, and the induced electric charges can be received by charge coupling by the force sense electrodes, thereby achieving a force sense function in a force detection period. A touch detection function can be achieved by the force sense electrodes additionally serving as the touch detection electrodes in a touch period. Therefore, the touch detection function and the force sense function can be achieved in the display panel.

In the force touch display panel according to the embodiments of the present disclosure, as shown in FIG. 5, the touch detection electrode may specifically include: a touch sense electrode Rx and a touch drive electrode Tx. A mutual-capacitance touch detection function is achieved by the force sense electrodes, and the force detection function is achieved by the force sense structure constituted by the three layers, i.e. the force common electrode layer 310, the piezoelectric material layer 320 and the force sense electrode layer 330.

In this case, in order that each of the force sense electrodes achieves a function of additionally serving as the touch sense electrode Rx and the touch drive electrode Tx, the force sense electrodes are generally blocky electrodes. In other words, the force sense electrode layer 330 is divided into the plurality of force sense electrodes arranged in an array. Then, the touch sense electrode Rx or the touch drive electrode Tx is formed by bridging. With the structure in which the force sense electrodes additionally serve as the touch sense electrode Rx and the touch drive electrode Tx, according to the embodiment, the time-sharing drive may be used for the touch detection and the force detection, or the simultaneous drive may also be used for the touch detection and the force detection, the force sense electrodes receive the force signal and the touch signal simultaneously, and the force signal and the touch signal may be separated in the back-end processing circuit.

Furthermore, embodiments shown in FIG. 5 provide a method of manufacturing a force touch display panel, and the method includes:

providing a piezoelectric material layer 320;

manufacturing a force sense electrode layer 330 and a force common electrode layer 310 on upper and lower surfaces of the piezoelectric material layer 320, respectively, thereby forming a force sense structure;

bonding the force common electrode layer 310 of the force sense structure to an OLED packaging structure (a packaging film 500) through an optical adhesive;

bonding a polarization layer 1100 to the force sense electrode layer 330 of the force sense structure through an optical adhesive; and forming a protective layer 1200 on the polarization layer 1100.

In this way, a mutual-capacitance structure of a single indium tin oxide (SITO) layer, and the force common electrode layer are formed directly on the upper and lower surfaces of the piezoelectric material layer 320, respectively, and then bonding the formed force sense structure between the polarization layer and the OLED packaging structure. Advantageous effects of the method are that the piezoelectric material layer 320 may substitute for a polyester film of a current touch film structure, and thus the force sense function can be added with a thickness unchanged.

Figure 6:
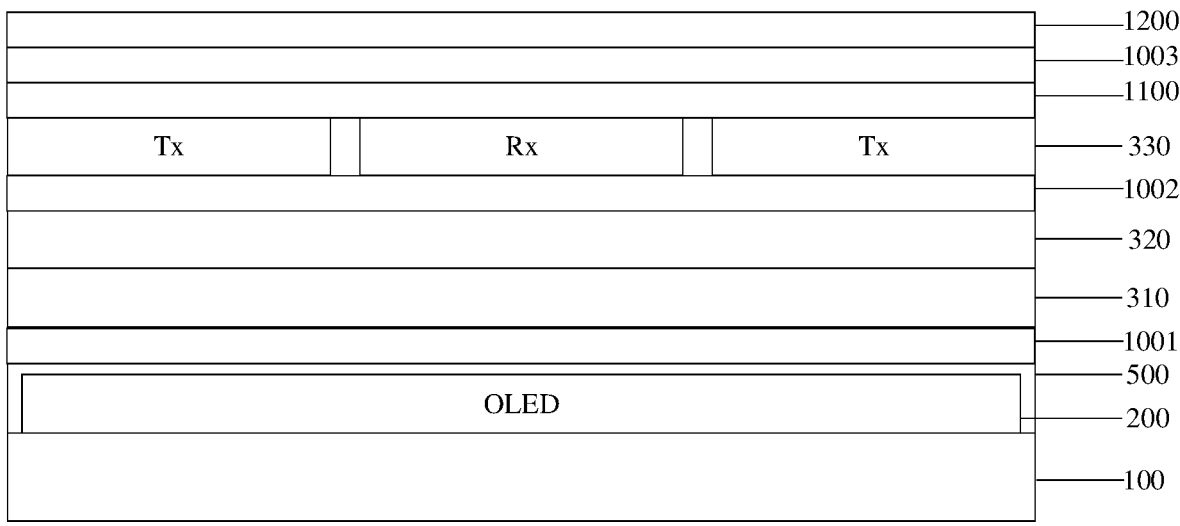
FIG. 6 is a schematic view showing a structure of a force touch display panel according to an embodiment of the present disclosure.

In the embodiment shown in FIG. 6, the force touch display panel includes: a substrate 100; a plurality of OLED display structures 200 disposed in a display area on the substrate 100; a packaging film 500 disposed on the organic light-emitting diodes OLED; a first optical adhesive layer 1001 disposed on the packaging film 500; a force common electrode layer 310 disposed on the first optical adhesive layer 1001; a piezoelectric material layer 320 disposed on the force common electrode layer 310; a second optical adhesive layer 1002 disposed on the piezoelectric material layer 320; a force sense electrode layer 330 disposed on the second optical adhesive layer 1002; a polarization layer 1100 disposed on the force sense electrode layer 330; a third optical adhesive layer 1003 disposed on the polarization layer 1100; and a protective layer 1200 disposed on the third optical adhesive layer 1003.

Here, the force sense electrode layer 330 is constituted by a plurality of force sense electrodes insulated from one another, and the force sense electrodes additionally serve as touch detection electrodes. Specifically, in the force touch display panel according to the embodiments of the present disclosure, induced electric charges are generated by the piezoelectric material layer 320 under the action of a force, and the induced electric charges can be received by charge coupling by the force sense electrodes, thereby achieving a force sense function in a force detection period. A touch detection function can be achieved by the force sense electrodes additionally serving as the touch detection electrodes in a touch period. Therefore, the touch detection function and the force sense function can be achieved in the display panel.

In the force touch display panel according to the embodiments of the present disclosure, as shown in FIG. 6, the touch detection electrode may specifically include: a touch sense electrode Rx and a touch drive electrode Tx. A mutual-capacitance touch detection function is achieved by the force sense electrodes, and the force detection function is achieved by the force sense structure constituted by the three layers, i.e. the force common electrode layer 310, the piezoelectric material layer 320 and the force sense electrode layer 330.

In this case, in order that each of the force sense electrodes achieves a function of additionally serving as the touch sense electrode Rx and the touch drive electrode Tx, the force sense electrodes are generally blocky electrodes. In other words, the force sense electrode layer 330 is divided into the plurality of force sense electrodes arranged in an array. Then, the touch sense electrode Rx or the touch drive electrode Tx is formed by bridging. With the structure in which the force sense electrodes additionally serve as the touch sense electrode Rx and the touch drive electrode Tx, according to the embodiment, the time-sharing drive may be used for the touch detection and the force detection, or the simultaneous drive may also be used for the touch detection and the force detection, the force sense electrodes receive the force signal and the touch signal simultaneously, and the force signal and the touch signal may be separated in the back-end processing circuit.

Furthermore, embodiments shown in FIG. 6 provide a method of manufacturing a force touch display panel, and the method includes:

providing a piezoelectric material layer 320, and depositing a force common electrode layer 310 on the piezoelectric material layer 320, thereby forming a force sense structure;

providing a polarization layer 1100, and manufacturing a force sense electrode layer 330 on the polarization layer 1100, thereby forming a touch structure;

bonding the force sense electrode layer 330 of the touch structure to the piezoelectric material layer 320 of the force sense structure through an optical adhesive;

bonding the force common electrode layer 310 of the force sense structure to an OLED packaging structure (a packaging film 500) through an optical adhesive; and bonding a protective layer 1200 to the polarization layer 1100 through an optical adhesive.

Figure 7:
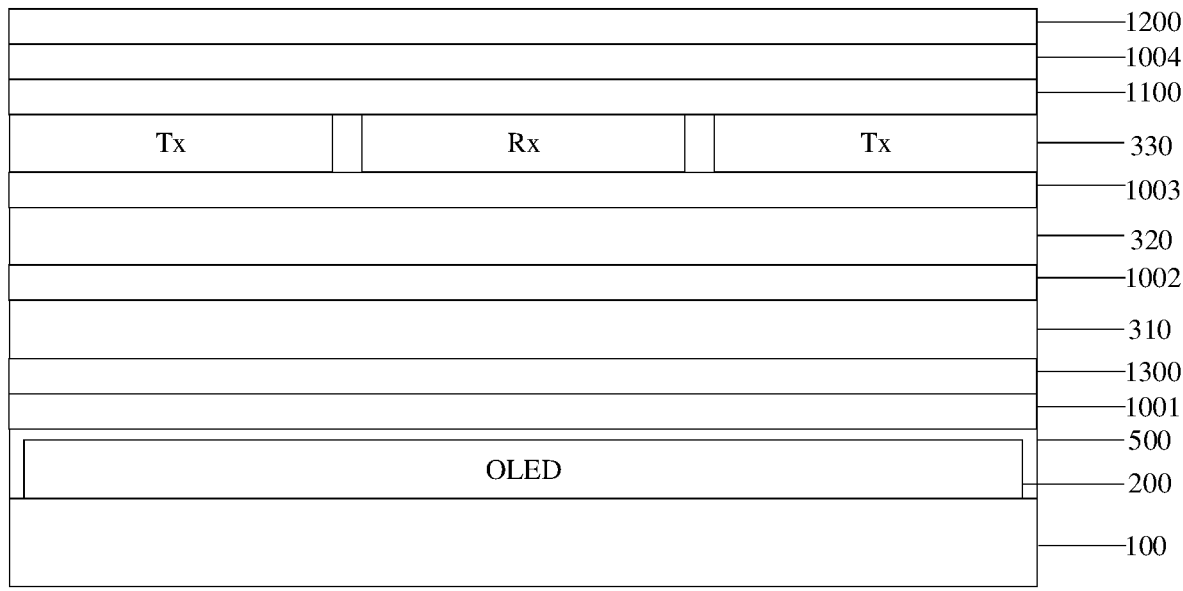
FIG. 7 is a schematic view showing a structure of a force touch display panel according to an embodiment of the present disclosure.

In the embodiment shown in FIG. 7, the force touch display panel includes: a substrate 100; a plurality of OLED display structures 200 disposed in a display area on the substrate 100; a packaging film 500 disposed on the organic light-emitting diodes OLED; a first optical adhesive layer 1001 disposed on the packaging film 500; a polyester film 1300 disposed on the first optical adhesive layer 1001; a force common electrode layer 310 disposed on the polyester film 1300; a second optical adhesive layer 1002 disposed on the force common electrode layer 310; a piezoelectric material layer 320 disposed on the second optical adhesive layer 1002; a third optical adhesive layer 1003 disposed on the piezoelectric material layer 320; a force sense electrode layer 330 disposed on the third optical adhesive layer 1003; a polarization layer 1100 disposed on the force sense electrode layer 330; a fourth optical adhesive layer 1004 disposed on the polarization layer 1100; and a protective layer 1200 disposed on the fourth optical adhesive layer 1004.

The present embodiment is different from the previous embodiment in that the force common electrode layer 310 is deposited on the polyester film 1300, and then they are bonded to the piezoelectric material layer 320 through the optical adhesive.

Here, the force sense electrode layer 330 is constituted by a plurality of force sense electrodes insulated from one another, and the force sense electrodes additionally serve as touch detection electrodes. Specifically, in the force touch display panel according to the embodiments of the present disclosure, induced electric charges are generated by the piezoelectric material layer 320 under the action of a force, and the induced electric charges can be received by charge coupling by the force sense electrodes, thereby achieving a force sense function in a force detection period. A touch detection function can be achieved by the force sense electrodes additionally serving as the touch detection electrodes in a touch period. Therefore, the touch detection function and the force sense function can be achieved in the display panel.

In the force touch display panel according to the embodiments of the present disclosure, as shown in FIG. 7, the touch detection electrode may specifically include: a touch sense electrode Rx and a touch drive electrode Tx. The mutual-capacitance touch detection function is achieved by the force sense electrodes, and the force detection function is achieved by the force sense structure constituted by the three layers, i.e. the force common electrode layer 310, the piezoelectric material layer 320 and the force sense electrode layer 330.

In this case, in order that each of the force sense electrodes achieves a function of additionally serving as the touch sense electrode Rx and the touch drive electrode Tx, the force sense electrodes are generally blocky electrodes. In other words, the force sense electrode layer 330 is divided into the plurality of force sense electrodes arranged in an array. Then, the touch sense electrode Rx or the touch drive electrode Tx is formed by bridging. With the structure in which the force sense electrodes additionally serve as the touch sense electrode Rx and the touch drive electrode Tx, according to the embodiment, the time-sharing drive may be used for the touch detection and the force detection, or the simultaneous drive may also be used for the touch detection and the force detection, the force sense electrodes receive the force signal and the touch signal simultaneously, and the force signal and the touch signal may be separated in the back-end processing circuit.

Furthermore, embodiments shown in FIG. 7 provide a method of manufacturing a force touch display panel, and the method includes:

depositing a force common electrode layer 310 on a polyester film 1300, and providing a piezoelectric material layer 320, and bonding the piezoelectric material layer 320 on a side, facing away from the polyester film 1300, of the force common electrode layer 310 through an optical adhesive, thereby forming a force sense structure;

providing a polarization layer 1100, and manufacturing a force sense electrode layer 330 on the polarization layer 1100, thereby forming a touch structure;

bonding the force sense electrode layer 330 of the touch structure to the piezoelectric material layer 320 of the force sense structure through an optical adhesive;

bonding the force common electrode layer 310 of the force sense structure to an OLED packaging structure (a packaging film 500) through an optical adhesive; and bonding a protective layer 1200 to the polarization layer 1100 through an optical adhesive.

Figure 8:
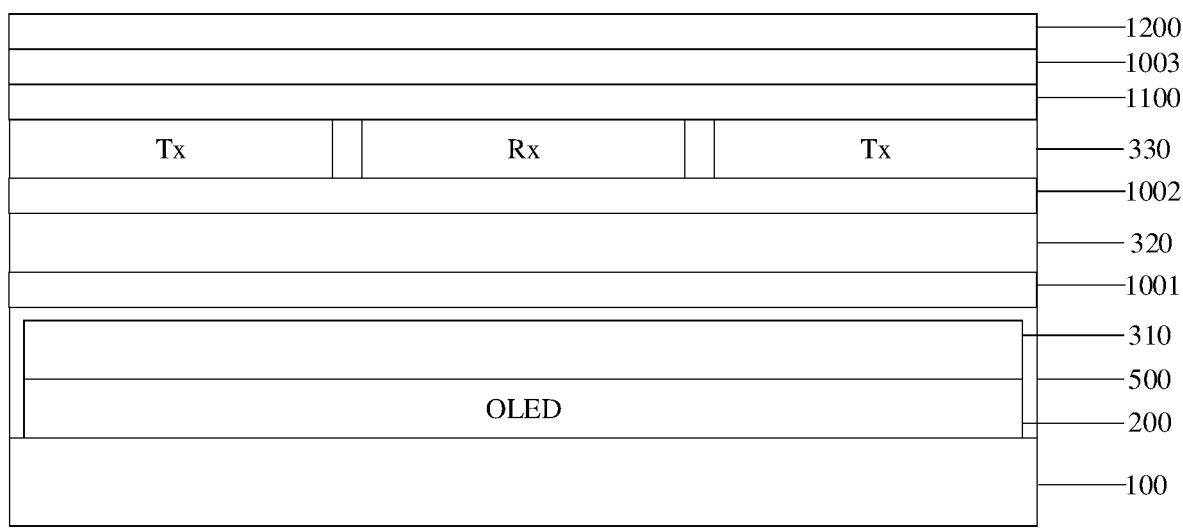
FIG. 8 is a schematic view showing a structure of a force touch display panel according to an embodiment of the present disclosure.

The OLED packaging structure shown in FIG. 8 is different from that shown in FIGS. 5-7. As shown in FIG. 8, the packaging film 500 is disposed between the piezoelectric material layer 320 and the force common electrode layer 310. In this case, in order to simplify a structure of films of the force touch display panel, the force common electrode layer 310 may additionally serve as a common cathode layer of the organic light-emitting diode OLED.

In the embodiment shown in FIG. 8, the force touch display panel includes: a substrate 100; a plurality of OLED display structures 200 disposed in a display area on the substrate 100; a force common electrode layer 310 disposed on the organic light-emitting diodes OLED; a packaging film 500 disposed on the force common electrode layer 310; a first optical adhesive layer 1001 disposed on the packaging film 500; a piezoelectric material layer 320 disposed on the first optical adhesive layer 1001; a second optical adhesive layer 1002 disposed on the piezoelectric material layer 320; a force sense electrode layer 330 disposed on the second optical adhesive layer 1002; a polarization layer 1100 disposed on the force sense electrode layer 330; a third optical adhesive layer 1003 disposed on the polarization layer 1100; and a protective layer 1200 disposed on the third optical adhesive layer 1003.

Here, the force sense electrode layer 330 is constituted by a plurality of force sense electrodes insulated from one another, and the force sense electrodes additionally serve as touch detection electrodes. Specifically, in the force touch display panel according to the embodiments of the present disclosure, induced electric charges are generated by the piezoelectric material layer 320 under the action of a force, and the induced electric charges can be received by charge coupling by the force sense electrodes, thereby achieving a force sense function in a force detection period. A touch detection function can be achieved by the force sense electrodes additionally serving as the touch detection electrodes in a touch period. Therefore, the touch detection function and the force sense function can be achieved in the display panel.

In the force touch display panel according to the embodiments of the present disclosure, as shown in FIG. 8, the touch detection electrode may specifically include: a touch sense electrode Rx and a touch drive electrode Tx. The mutual-capacitance touch detection function is achieved by the force sense electrodes, and the force detection function is achieved by the force sense structure constituted by the three layers, i.e. the force common electrode layer 310, the piezoelectric material layer 320 and the force sense electrode layer 330.

In this case, in order that each of the force sense electrodes achieves a function of additionally serving as the touch sense electrode Rx and the touch drive electrode Tx, the force sense electrodes are generally blocky electrodes. In other words, the force sense electrode layer 330 is divided into the plurality of force sense electrodes arranged in an array. Then, the touch sense electrode Rx or the touch drive electrode Tx is formed by bridging. With the structure in which the force sense electrodes additionally serve as the touch sense electrode Rx and the touch drive electrode Tx, according to the embodiment, the time-sharing drive may be used for the touch detection and the force detection, or the simultaneous drive may also be used for the touch detection and the force detection, the force sense electrodes receive the force signal and the touch signal simultaneously, and the force signal and the touch signal may be separated in the back-end processing circuit.

Furthermore, embodiments shown in FIG. 8 provide a method of manufacturing a force touch display panel, and the method includes:

providing a piezoelectric material layer 320;

providing a polarization layer 1100, and manufacturing a force sense electrode layer 330 on the polarization layer 1100, thereby forming a touch structure;

providing an OLED display structure 200, wherein a common cathode layer of the OLED display structure 200 additionally serves as a force common electrode layer 310, and the packaging film 500 is formed on the force common electrode layer 310, thereby forming an OLED packaging structure;

bonding the piezoelectric material layer 320 to the packaging film 500 of the OLED packaging structure through an optical adhesive; and bonding the force sense electrode layer 330 of a touch structure to the piezoelectric material layer 320 through an optical adhesive; and bonding a protective layer 1200 to the polarization layer 1100 through an optical adhesive.

In this way, the common cathode layer of the OLED display structure 200 is directly utilized to additionally serve as the force common electrode layer 310 without the need to depose the force common electrode layer 310 on the piezoelectric material layer 320, simplifying the structure of the films of the force touch display panel.

Based on the same inventive concept, embodiments of the present disclosure further provide a display apparatus including the force touch display panel according to the embodiment of the present disclosure. The display apparatus may include any products or parts having a displaying function, such as a mobile phone, a tablet computer, a TV, a display, a notebook computer, a digital frame, and a navigator. The embodiments of the force touch display panel may be referred to for implementations of the display apparatus and repeated contents are no longer described for the sake of brevity.

In the force touch display panel, the detection method thereof, and the display apparatus according to the embodiment of the present disclosure, the force common electrode layer, the piezoelectric material layer, and the force sense electrode layer are stacked in sequence over the plurality of display structures in the display area. The force sense electrode layer is constituted by a plurality of force sense electrodes insulated from one another, and the force sense electrodes additionally serve as the touch detection electrodes. Induced electric charges are generated by the piezoelectric material layer under the action of a force, and the induced electric charges can be received by charge coupling by the force sense electrodes, thereby achieving a force sense function in a force detection period. A touch detection function can be achieved by the force sense electrodes additionally serving as the touch detection electrodes in a touch period. Therefore, the touch detection function and the force sense function can be achieved in the display panel.

Apparently, various changes and modifications to the embodiments of the present disclosure may be made by those skilled in the art without departing from the spirit and scope of the present disclosure. Therefore, if these amendments and modifications to the present disclosure belong to the scope defined in the appended claims of the present disclosure and their equivalents, the present disclosure is intended to include the changes and modifications.

What is claimed is:

1. A force touch display panel comprising:
a substrate;
a display structure disposed in a display area on the substrate;
a force common electrode layer, a piezoelectric material layer, and a force sense electrode layer, which are stacked in sequence over the display structure, wherein the force sense electrode layer comprises a force sense electrode configured for identifying different forces, and the force sense electrode additionally serves as a touch detection electrode configured for identifying a touch operation; and
a first insulating layer disposed between the force common electrode layer and the piezoelectric material layer; and/or a second insulating layer disposed between the piezoelectric material layer and the force sense electrode layer.

2. The force touch display panel of claim 1, wherein:
the force sense electrode layer comprises a plurality of said force sense electrodes insulated from one another.

3. The force touch display panel of claim 1, wherein:
the display structure is an organic light-emitting diode;
the force touch display panel further comprises: a packaging film disposed over the organic light-emitting diode; and
the packaging film is disposed between the organic light-emitting diode and the force common electrode layer; or the packaging film is disposed between the piezoelectric material layer and the force common electrode layer, and the force common electrode layer additionally serves as a common cathode layer of the organic light-emitting diode.

4. The force touch display panel of claim 1, wherein:
the display structure is a liquid crystal display structure;
the force touch display panel further comprises: an opposite substrate disposed over the liquid crystal display structure; and the opposite substrate is disposed between the piezoelectric material layer and the force common electrode layer, the force common electrode layer additionally serves as a common electrode layer of the liquid crystal display structure, and the common electrode layer is disposed on a side, facing towards the substrate, of the opposite substrate.

5. The force touch display panel of claim 1, wherein:
the piezoelectric material layer is a continuous piezoelectric material layer over the entire substrate.

6. The force touch display panel of claim 1, wherein:
the force common electrode layer is a continuous piezoelectric common electrode layer over the entire substrate.

7. The force touch display panel of claim 1, wherein:
the touch detection electrode is a self-capacitance electrode.

8. The force touch display panel of claim 1, wherein:
the touch detection electrode is a touch sense electrode; and
the force touch display panel further comprises: a touch drive electrode layer disposed between the force sense electrode layer and the piezoelectric material layer; and an insulating layer disposed between the touch drive electrode layer and the force sense electrode layer, wherein:
the touch drive electrode layer comprises a plurality of touch drive electrodes insulated from one another.

9. The force touch display panel of claim 1, wherein:
the touch detection electrode is a touch drive electrode;
the force touch display panel further comprises: an insulating layer and a touch sense electrode layer which are stacked in sequence on the force sense electrode layer, wherein:
the touch sense electrode layer comprises a plurality of touch sense electrodes insulated from one another.

10. The force touch display panel of claim 1, wherein:
an optical adhesive layer is disposed between at least two adjacent ones of the force common electrode layer, the piezoelectric material layer and the force sense electrode layer.

11. A display apparatus comprising: the force touch display panel of claim 1.

12. A method of manufacturing the force touch display panel of claim 1, the method comprising:
providing the substrate;
forming the display structure in the display area on the substrate; and
forming the force common electrode layer, the piezoelectric material layer, and the force sense electrode layer in sequence in a stack over the display structure.

13. The method of claim 12, wherein:
forming the force common electrode layer, the piezoelectric material layer, and the force sense electrode layer comprises:
forming the piezoelectric material layer directly on the force common electrode layer; or
forming the force sense electrode layer directly on the piezoelectric material layer.

14. The method of claim 12, wherein:
forming the force common electrode layer, the piezoelectric material layer, and the force sense electrode layer comprises:
forming a force sense structure based on the force common electrode layer and the piezoelectric material layer;

forming a touch structure based on the force sense electrode layer; and
bonding the force sense structure and the touch structure together through an optical adhesive.

15. The method of claim 14, wherein:
forming the force sense structure comprises bonding at least two adjacent layers of the force sense structure through an optical adhesive.

16. The method of claim 14, wherein:
forming the touch structure comprises bonding at least two adjacent layers of the touch structure through an optical adhesive.

17. The force touch display panel of claim 1, wherein:
the display structure is a liquid crystal display structure;
the force touch display panel further comprises: an opposite substrate disposed over the liquid crystal display structure; and
the opposite substrate is disposed between the liquid crystal display structure and the force common electrode layer.

18. A force touch display panel comprising:
a substrate;
a display structure disposed in a display area on the substrate;
a force common electrode layer, a piezoelectric material layer, and a force sense electrode layer, which are stacked in sequence over the display structure, wherein the force sense electrode layer comprises a force sense electrode configured for identifying different forces, and the force sense electrode additionally serves as a touch detection electrode configured for identifying a touch operation, wherein:
the touch detection electrode is a touch sense electrode; and
the force common electrode layer comprises a plurality of force common electrodes insulated from one another, and the plurality of force common electrodes additionally serve as touch drive electrodes.

19. A detection method of a force touch display panel, the force touch display panel comprising:
a substrate;
a display structure disposed in a display area on the substrate;
a force common electrode layer, a piezoelectric material layer, and a force sense electrode layer, which are stacked in sequence over the display structure, wherein the force sense electrode layer comprises a force sense electrode configured for identifying different forces, and the force sense electrode additionally serves as a touch detection electrode configured for identifying a touch operation; and
a first insulating layer disposed between the force common electrode layer and the piezoelectric material layer; and/or a second insulating layer disposed between the piezoelectric material layer and the force sense electrode layer,
the detection method comprising:
in a touch detection period, detecting a touched position by the force sense electrode that additionally serves as the touch detection electrode; and
in a force detection period, loading a constant electric potential to the force common electrode layer, and detecting a quantity of induced electric charges which are generated by the piezoelectric material layer under the action of a force and which are received by charge coupling by the force sense electrode, thereby detecting a position where the force acts, wherein the touch detection period and the force detection period are a same period.

\* \* \* \* \*